(12) United States Patent
Takano et al.

(10) Patent No.: US 12,719,440 B2
(45) **Date of Patent: *Aug. 25, 2026**

(54) BULK ACOUSTIC WAVE DEVICE PACKAGING WITH REDISTRIBUTION USING SILICON DIOXIDE INSULATION

(71) Applicant: SKYWORKS SOLUTIONS, INC., Irvine, CA (US)

(72) Inventors: Atsushi Takano, Kadoma (JP); Mitsuhiro Furukawa, Nishinomiya (JP); Yusuke Horiguchi, Osaka (JP)

(73) Assignee: SKYWORKS SOLUTIONS, INC., Irvine, CA (US)

(*) Notice: Subject to any disclaimer, the term of this patent is extended or adjusted under 35 U.S.C. 154(b) by 995 days.

This patent is subject to a terminal disclaimer.

(21) Appl. No.: 17/938,114

(22) Filed: Oct. 5, 2022

(65) Prior Publication Data

US 2023/0115592 A1 Apr. 13, 2023

Related U.S. Application Data

(60) Provisional application No. 63/253,217, filed on Oct. 7, 2021.

(51) Int. Cl.

| | |
|---|---|
| ***H03H 9/02*** | (2006.01) |
| ***H03H 3/007*** | (2006.01) |
| ***H03H 9/15*** | (2006.01) |
| ***H03H 9/24*** | (2006.01) |

(52) U.S. Cl.

CPC ...... *H03H 9/02244* (2013.01); *H03H 3/0072* (2013.01); *H03H 9/15* (2013.01); *H03H 9/2405* (2013.01)

(58) Field of Classification Search

CPC .......... H03H 3/0072; H03H 3/08; H03H 3/02; H03H 9/15; H03H 9/2405; H03H 9/1014; H03H 9/1071

See application file for complete search history.

(56) References Cited

U.S. PATENT DOCUMENTS

| | | | | |
|---|---|---|---|---|
| 12,087,700 | B2 * | 9/2024 | Pietambaram | H01L 23/5386 |
| 2018/0159503 | A1 * | 6/2018 | Takano | H03H 9/17 |
| 2024/0097640 | A1 * | 3/2024 | Takano | H03H 3/02 |
| 2024/0305271 | A1 * | 9/2024 | Yamazaki | H03H 9/14541 |

* cited by examiner

*Primary Examiner* — J. San Martin

(74) *Attorney, Agent, or Firm* — Lando & Anastasi, LLP

(57) ABSTRACT

An electronic device package comprises an electrical device disposed on a base substrate, a conductive column in electrical communication with the electrical device and having a first end bonded to the base substrate, a cap substrate disposed over the electrical device and bonded to a second end of the conductive column, a layer of dielectric material disposed on the lower surface of the base substrate, a through substrate via in electrical communication with the conductive column and passing through the base substrate and the layer of dielectric material, a redistribution layer disposed on the layer of dielectric material, and a contact pad formed on the redistribution layer and in electrical communication with the through substrate via through the redistribution layer, the contact pad being horizontally displaced from a position directly below the through substrate via.

23 Claims, 13 Drawing Sheets

200
230
220
280
240
195
190
160
140
270
h
d
120
110
105
130
f
g
e
b
a
c
150
k
j
i

BULK ACOUSTIC WAVE DEVICE PACKAGING WITH REDISTRIBUTION USING SILICON DIOXIDE INSULATION

CROSS-REFERENCE TO RELATED APPLICATIONS

This application claims priority under 35 U.S.C. § 119(e) to U.S. Provisional Patent Application Ser. No. 63/253,217, titled "BULK ACOUSTIC WAVE DEVICE PACKAGING WITH REDISTRIBUTION USING SILICON DIOXIDE INSULATION," filed Oct. 7, 2021, the entire contents of which is incorporated herein by reference for all purposes.

BACKGROUND

1. Field of Invention

Aspects and embodiments disclosed herein relate generally to electronic devices and apparatus and methods for packaging the same. More particularly, at least some embodiments are directed to flip chip electronic or electrical device packages and packaging processes that incorporate cavities around electronic or electrical devices.

2. Discussion of Related Art

Radio frequency integrated circuits (RFICs) are widely used in wireless devices, such as cellular telephones, laptops, personal digital assistants, etc. RFICs combine transmission lines, matching networks, and discrete components, such as inductors, resistors, capacitors, and transistors, on an integration media to provide a subsystem capable of transmitting and receiving high frequency signals, for example, in a range of from about 0.1 to about 100 Gigahertz (GHz). Packaging of RFICs is distinctly different from packaging of more conventional integrated circuits (ICs) due to the fact that the package is often part of the RF circuit, and because the complex RF electrical and/or magnetic fields of the RFIC can interact with any nearby insulators and conductors. To meet growing demands in the wireless industry, RFIC packaging development seeks to provide smaller, lower cost, higher performance devices that can accommodate multi-die RF modules while providing high reliability and using lead-free solder and other "green" materials. The single chip package, in which single- or multi-die RFICs are individually packaged, is a direct solution to the small size and low cost requirements of RFICs, and is currently used for many RFICs.

Micro electromechanical systems (MEMS) enable controlled conversions between micro-scale mechanical motion and specified electrical signals, for example, with specified frequencies. MEMS are becoming widely used in RFICs. Based on mechanical movements, RF MEMS can achieve excellent signal quality factors for RF band filters, including surface acoustic wave (SAW) filters, bulk acoustic wave (BAW) filters, and high frequency RF switches. SAW filters, for example, convert electrical signals into a mechanical wave that is delayed as it propagates across a piezoelectric crystal substrate before being converted back into an electrical signal. BAW filters use volume bulk movement to achieve a specific desired resonance, and in RF switches, electrical signals are used to control movement of a microelectrode to turn the switch ON or OFF. Current MEMS technologies have evolved from semiconductor fabrication processing. However, the mechanical motion uniquely associated with MEMS demands very different packaging constructions and requirements from conventional semiconductor ICs. In particular, inside many MEMS ICs, some materials should move freely, without interference, and therefore, MEMS ICs are typically "capped" to form a small vacuum or air cavity around the moving materials to protect them while permitting their movements.

SUMMARY

At least some aspects and embodiments are directed to packages and packaging processes that provide the cavities required by MEMS or other devices and increases the flexibility for placement of the packaged device in a module.

In accordance with one aspect, there is provided an electronic device package. The electronic device package comprises a base substrate having an upper surface and a lower surface, an electrical device disposed on the upper surface of the base substrate, a conductive column in electrical communication with the electrical device and having a first end bonded to the upper surface of the base substrate, a cap substrate disposed over the electrical device and having a lower surface bonded to a second end of the conductive column, a layer of dielectric material having an upper surface disposed on the lower surface of the base substrate, a through substrate via in electrical communication with the conductive column and passing through the base substrate and the layer of dielectric material, a redistribution layer disposed on a lower surface of the layer of dielectric material, and a contact pad formed on a lower surface of the redistribution layer and in electrical communication with the through substrate via through the redistribution layer, the contact pad being horizontally displaced from a position directly below the through substrate via, to improve flexibility for mounting the electronic device packaging structure on an electronics module.

In some embodiments, the base substrate is formed of high resistivity silicon.

In some embodiments, the contact pad at least partially overlaps the through substrate via.

In some embodiments, the contact pad does not overlap the through substrate via.

In some embodiments, the conductive column is bonded with a solder bond to one of the upper surface of the base substrate or the lower surface of the cap substrate.

In some embodiments, the electronic device package further comprises a buffer coat layer disposed on a lower surface of the redistribution layer and in contact with sides of the contact pad, the buffer coat layer being formed of a material having a lower curing temperature than a melting temperature of the solder bond.

In some embodiments, the curing temperature of the material of the buffer coat layer is 200° C. or less.

In some embodiments, the buffer coat layer comprises polyimide.

In some embodiments, the layer of dielectric material is formed of a material having a deposition temperature less than a melting temperature of the solder bond.

In some embodiments, a deposition temperature of the layer of dielectric material is 200° C. or less.

In some embodiments, wherein the layer of dielectric material comprises silicon dioxide.

In some embodiments, the redistribution layer includes a bond pad that is not centered below the through substrate via.

In some embodiments, the redistribution layer is formed of a material having a lower deposition temperature than a melting temperature of the solder bond.

In some embodiments, the deposition temperature of the redistribution layer is 200° C. or less.

In some embodiments, the redistribution layer comprises copper.

In some embodiments, the electrical device is a MEMS device.

In some embodiments, the electrical device is an acoustic wave resonator.

In some embodiments, an electronic device module includes the electronic device package as described above.

In some embodiments, an electronic device includes the electronic device module described above.

In accordance with another aspect, there is provided a method of manufacturing a packaged electronic device. The method comprises forming an electronic device in an upper surface of a base substrate, forming a conductive column in electrical communication with the electrical device and having a first end bonded to the upper surface of the base substrate, mounting a cap substrate over the electrical device, mounting the cap substrate including bonding a lower surface of the cap substrate to a second end of the conductive column, depositing a layer of dielectric material having on the lower surface of the base substrate, forming a through substrate via in electrical communication with the conductive column and passing through the base substrate and the layer of dielectric material, depositing a redistribution layer on a lower surface of the layer of dielectric material, and forming a contact pad on a lower surface of the redistribution layer and in electrical communication with the through substrate via through the redistribution layer, the contact pad being horizontally displaced from a position directly below the through substrate via.

In some embodiments, the method further comprises depositing a buffer coat layer on a lower surface of the redistribution layer and in contact with sides of the contact pad, the buffer coat layer being formed of a material having a lower curing temperature than a melting temperature of the solder bond.

In some embodiments, the layer of dielectric material is deposited at a temperature lower than a melting temperature of the solder bond.

In some embodiments, the redistribution layer is deposited at a temperature lower than a melting temperature of the solder bond.

BRIEF DESCRIPTION OF DRAWINGS

Various aspects of at least one embodiment are discussed below with reference to the accompanying drawings. In the drawings, which are not intended to be drawn to scale, each identical or nearly identical component that is illustrated in various drawings is represented by a like numeral. For purposes of clarity, not every component may be labeled in every drawing. The drawings are provided for the purposes of illustration and explanation, and are not intended as a definition of the limits of the invention. In the drawings.

DETAILED DESCRIPTION

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements, and features discussed in connection with any one or more embodiments are not intended to be excluded from a similar role in any other embodiments. Any references to front and back, left and right, top and bottom, and upper and lower are intended for convenience of description, not to limit the present systems and methods or their components to any one positional or spatial orientation. Also, the phraseology and terminology used herein is for the purpose of description and should not be regarded as limiting. The use herein of “including,” “comprising,” “having,” “containing,” “involving,” and variations thereof is meant to encompass the items listed thereafter and equivalents thereof as well as additional items. The term “electronic device” is to be understood as encompassing semiconductor die, RF devices, MEMS devices, and other electrical components that may be packaged in a package according to embodiments disclosed herein.

Figure 1:
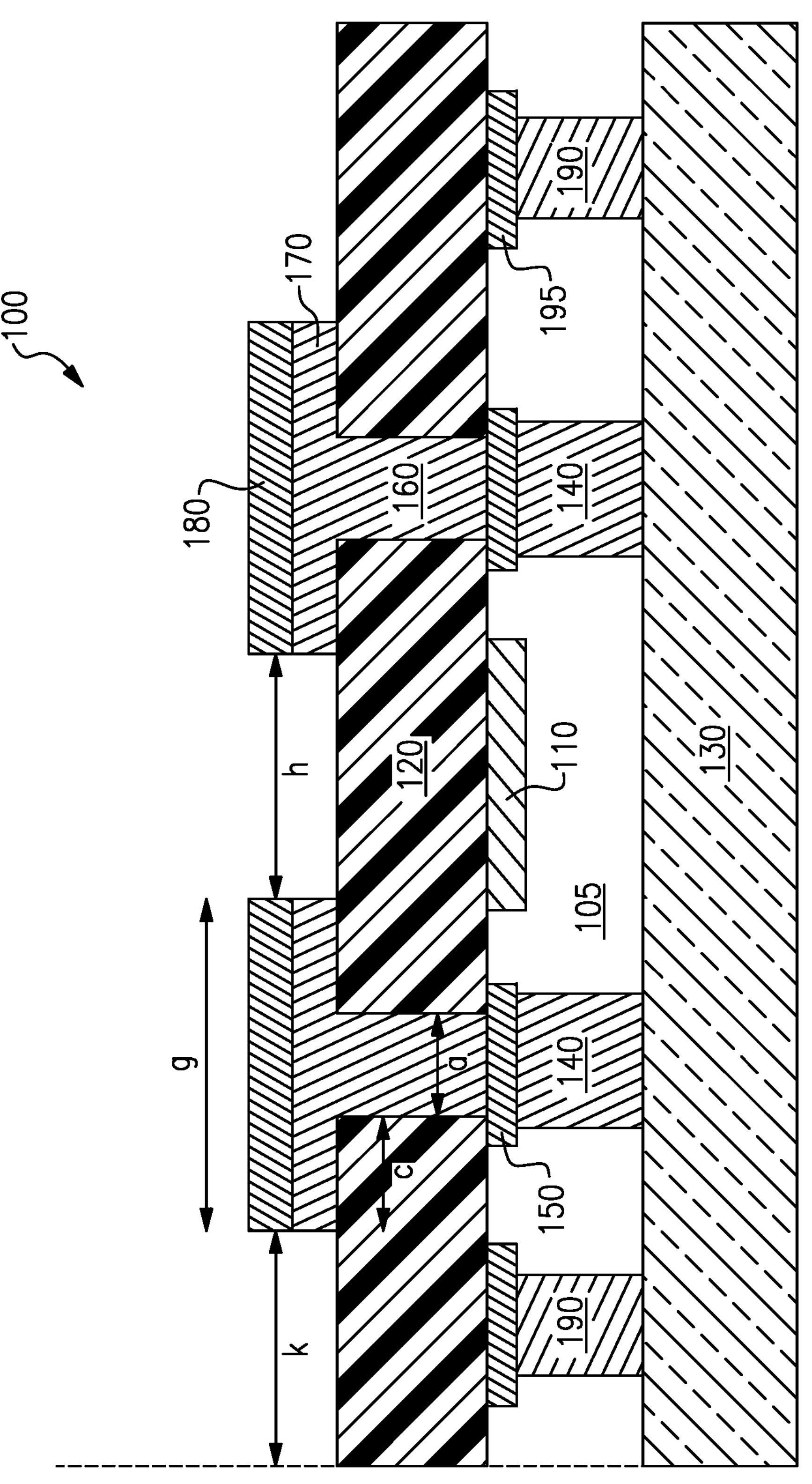
FIG. 1 is a cross-sectional diagram of an example of a packaging structure for a microelectromechanical system device.

Referring to FIG. 1, there is illustrated a cross-sectional view of one example of a packaged microelectromechanical system device, indicated generally at 100. FIG. 1 is an inverted view of the packaged device so the terms “upper” and “lower” in the following description are reversed from the orientation illustrated in FIG. 1. A microelectromechanical system (MEMS) device 110, for example, a surface acoustic wave device or bulk acoustic wave device may be disposed on a base substrate 120, which in various embodiments may be formed of or include a piezoelectric material. The piezoelectric material may be lithium niobate, lithium tantalate, quartz, or other piezoelectric materials known in the art. A cap substrate 130 is disposed over the MEMS device and base substrate 120 (the structure in inverted in FIG. 1 so the cap substrate 130 appears below the base substrate 120). The cap substrate 130 may be or include, for example, glass, sapphire, a ceramic material, a semiconductor, or other material known for use in cap substrates known in the art.

Conductive columns 140 formed of, for example, copper that are in electrical communication with the MEMS device extend upward from the upper surface of the base substrate 120 to the lower surface of the cap substrate 130. The conductive columns 140 are electrically connected with, for example, solder bonds 150 to through-substrate vias (TSVs) 160 that pass through the base substrate 120 and terminate in bond pads 170 on a lower surface of the base substrate 120. The solder bonds 150 may be formed of, for example, a SnCuAu alloy with a melting temperature of about 310° C. The bond pads 170 are centered on the top of the TSVs 160. A solder material 180 may be disposed on the bond pads 170 and form a land grid array (LGA) or ball grid array (BGA) to facilitate connection of the package 100 to a circuit board of an electronics module. A metal seal ring 190 extends from the upper surface of the base substrate 120 to the lower surface of the cap substrate 130 and may surround the MEMS device 110 and conductive columns 140. The metal seal ring 190 may be bonded to the base substrate 120, cap substrate 130, or both by, for example, solder bonds 195. The solder bonds 195 may be formed of, for example, a SnCuAu alloy with a melting temperature of about 310° C. The metal seal ring along with the upper surface of the base substrate 120 and the lower surface of the cap substrate 130 define a hermetically sealed cavity 105 housing the MEMS device 110.

In the package 100 of FIG. 1, the LGA and BGA solder material 180 is located directly below and centered on the TSVs 160, so there is no flexibility between device layout and terminal layout through the TSVs 160. This limits device design flexibility and further die size reduction due to layout rules. Table 1 below includes various design/layout rules that a packaged device such as packaged device 100 may be subject to due to constraints of manufacturing equipment for the package.

TABLE 1

Example layout rules for packaged MEMS device 100

| Symbol in FIG. 1 | Comment | Layout Rule |
|---|---|---|
| a | Minimum TSV diameter | 30 μm |
| c | Minimum enclosure between TSV and pad edge | 25 μm |
| g | Minimum pad size | 100 μm × 170 μm |
| h | Minimum pad spacing | 100 μm |
| k | Minim spacing between edge of carrier substrate and edge of pad | 67 μm |

Figure 2:
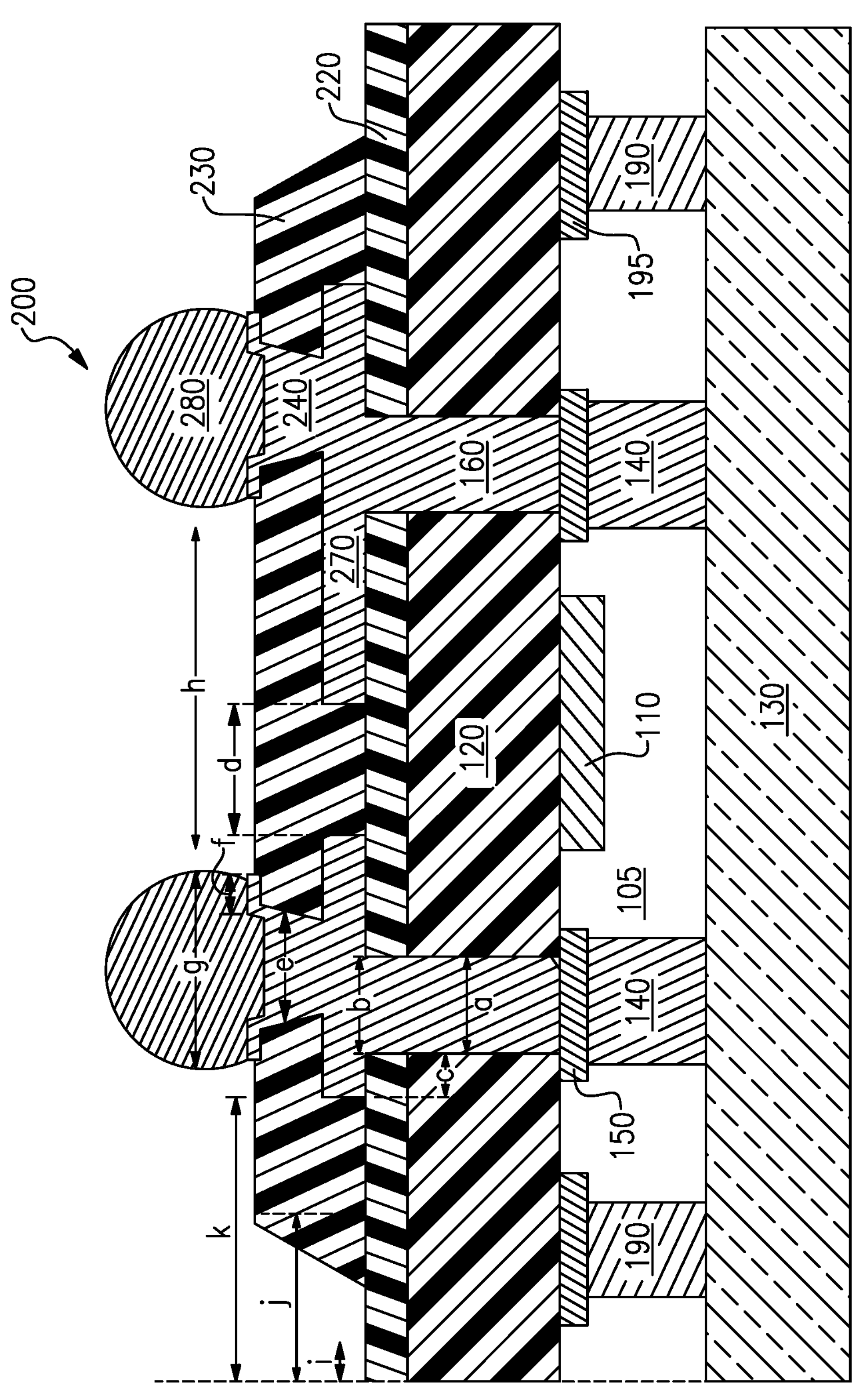
FIG. 2 is a cross-sectional diagram of another example of a packaging structure for a microelectromechanical system device.

A packaging structure that increases flexibility of positioning the package on a mounting substrate or module is illustrated in FIG. 2, indicated generally at 200, where features corresponding to the features illustrated in FIG. 1 are provided with the same reference numbers. Packaging structure 200 is also illustrated in an inverted view. Differences between the packaging structure 200 of FIG. 2 and the packaging structure 100 of FIG. 1 include that in the packaging structure 200 of FIG. 2, the bond pads 270, (also referred to herein as the redistribution layer or second layer 270), are not formed directly on top of the base substrate 120. Rather, a dielectric material layer 220 (also referred to as a first layer 220 herein) is formed on the lower surface of the base substrate 120 and the redistribution layer/bond pads 270 are formed on the lower surface of the dielectric material layer 220. The dielectric material layer 220 may include or consist of, for example, silicon dioxide. The dielectric material layer 220 may be deposited after formation of solder bonds 150 and 195, and may be deposited using a low temperature process, for example, low temperature tetraethyl orthosilicate chemical vapor deposition (TEOS CVD) at a lower temperature than a reflow temperature or melting temperature of the solder bonds 150 and 195. The TEOS CVD process may be performed at temperatures as low as, for example, about 200° C. or lower.

The packaging structure 200 may be provided with solder balls 280 disposed on under-bump metallization structures 240, also referred to herein as contact pads, as illustrated in FIG. 2. In contrast with the packaging structure 100 of FIG. 1 the solder connections (solder balls 280) for connections to the external circuit board or module are not located directly below the TSVs 160. Rather, the bond pads 270 of the bonding structure 200 of FIG. 2 are formed such that they are not centered below the TSVs 160 but are horizontally offset from a position that would be centered below the TSVs 160. The under-bump metallization structures/contact pads 240 may also be horizontally offset from the center or middle of the bond pads 270 so they may be even further horizontally offset from a position directly below the TSVs 160. In alternate embodiments, the solder balls may be replaced with contact pads so that the packaging structure includes a land grid array (LGA) rather than a ball grid array (BGA).

The packaging structure 200 of FIG. 2 also includes a dielectric layer 230 (also referred to as third layer 230 herein) at least partially disposed on the lower surface of the dielectric material layer 220. The dielectric material layer 230 provides insulation between the different bond pads 270 and the different under-bump metallization structures/contact pads 240 as well as provides protection for the bond pads 270 and at least part of the dielectric material layer 220. The dielectric material layer 230 comprise or consists of a low-temperature photosensitive buffer coat material, for example, a soft polyimide and may thus also be referred to as a buffer coat layer 230. The dielectric material layer 230 may be deposited using, for example, a spin-on process and patterned using photolithography methods known in the art, all performed at temperatures below the melting temperature of the solder bonds 150 and 195. Commercially available materials that may be suitable for the buffer coat layer 230 include PHOTONEECE™ photosensitive polyimide (LT series having a curing temperature of 170-250° C., PN series having a curing temperature of 200 to 350° C., PW series having a curing temperature of 320 to 350° C.), available from Toray Industries Inc., HD4100 or HD8800 photodefinable polyimide, available from HD Microsystems, PIMEL™ photosensitive polyimide, available from Asahi Kasei Corporation, or ELPAC™ (cure temperature ≤200° C.) or LUMILON™ photosensitive dielectric material, available from JSR Corporation.

Layout rules associated with the packaging structure 200 of FIG. 2 may include the following, with reference made to the reference symbols in FIG. 2:

TABLE 2

Example layout rules for packaged MEMS device 200

| Symbol in FIG. 2 | Comment | Layout Rule |
|---|---|---|
| a | Minimum TSV diameter | 30 μm |
| b | Minimum first layer opening | 30 μm |
| c | Minimum enclosure between first layer and redistribution layer | 25 μm |
| d | Minimum spacing between redistribution layers | 20 μm |
| e | Minimum second layer opening | 60 μm |
| f | Minimum enclosure between second layer and pad | 15 μm |
| g | Minimum pad size | 90 μm |
| h | Pad spacing | 90-165 μm |
| i | Fixed space between chip edge and first layer | 0 μm |
| j | Fixed space between first and second layer | 41.5 μm |
| k | Minim spacing between edge of carrier substrate and edge of pad | 67 μm |

Figure 3:
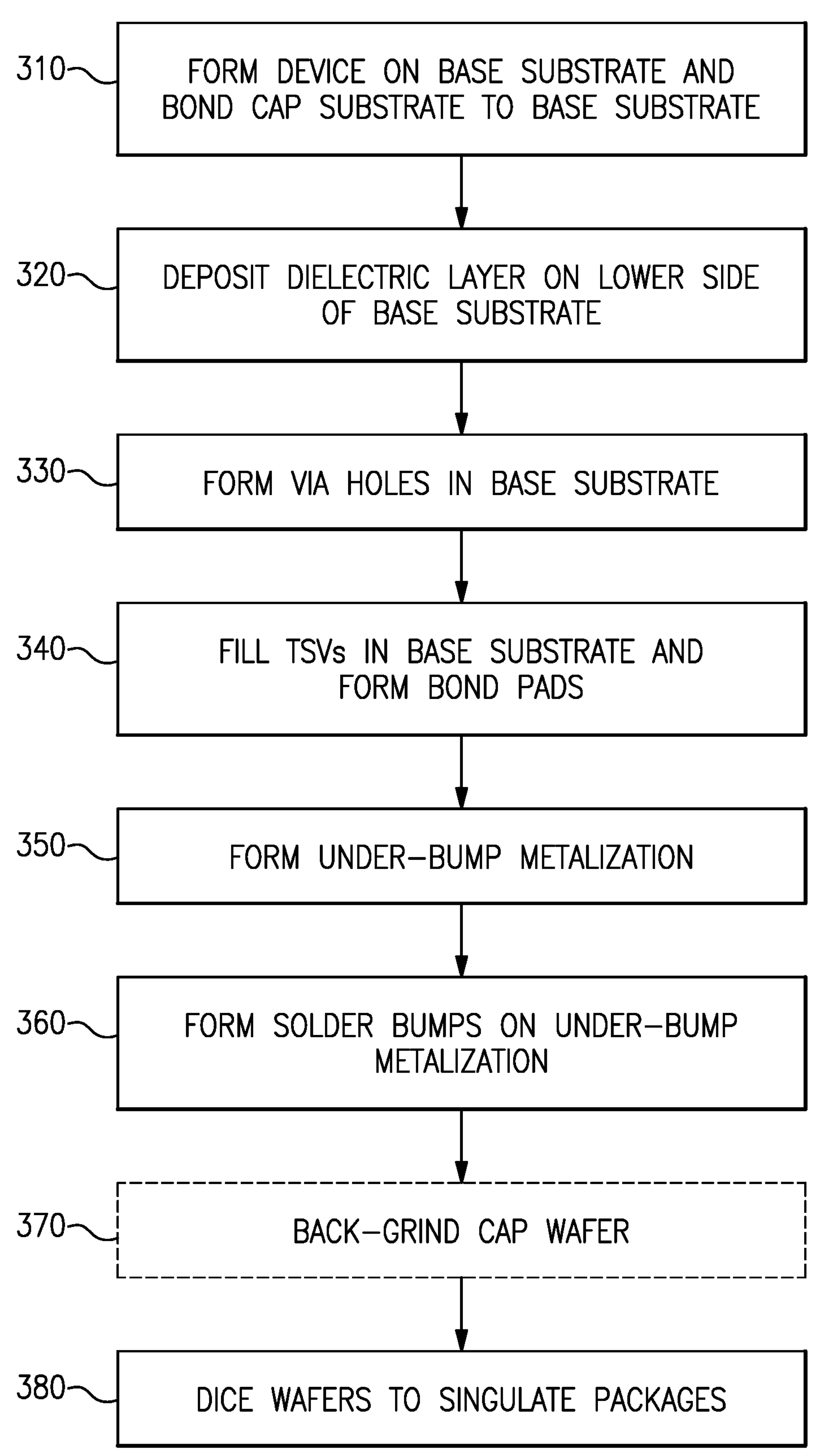
FIG. 3 is a flowchart of a method of making the packaging structure of FIG. 2.

A method of forming the packaging structure 200 of FIG. 2 will now be described with reference to the flowchart of FIG. 3 and the corresponding diagrams in FIGS. 4A-4E. In the figures only a single packaging structure is illustrated, although it is understood that this fabrication process could be performed on entire wafers to concurrently form multiple of the disclosed packaging structures that could then be diced to singulate the multiple packaging structures.

Figure 4A:
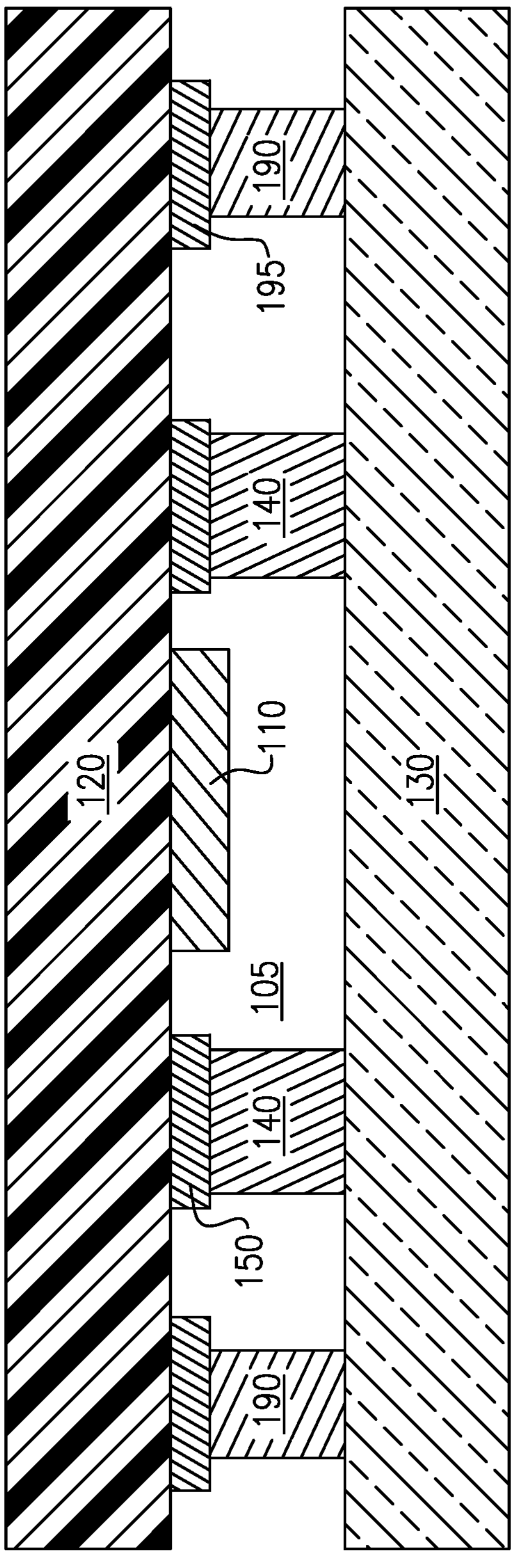
FIG. 4A illustrates a step in making the packaging structure of FIG. 2.

In act 310, a MEMS device 110, for example, a SAW or BAW resonator, is formed on a base wafer 120, for example, a piezoelectric substrate, and a cap wafer 130 is bonded to the base wafer by, for example, soldering 150, 195 to conductive columns 140 and a metal seal ring 190 extending from the base wafer 120, forming a cavity enclosing the MEMS device. This act may be performed using conventional methods known in the art. The resultant structure is illustrated in FIG. 4A.

Figure 4B:
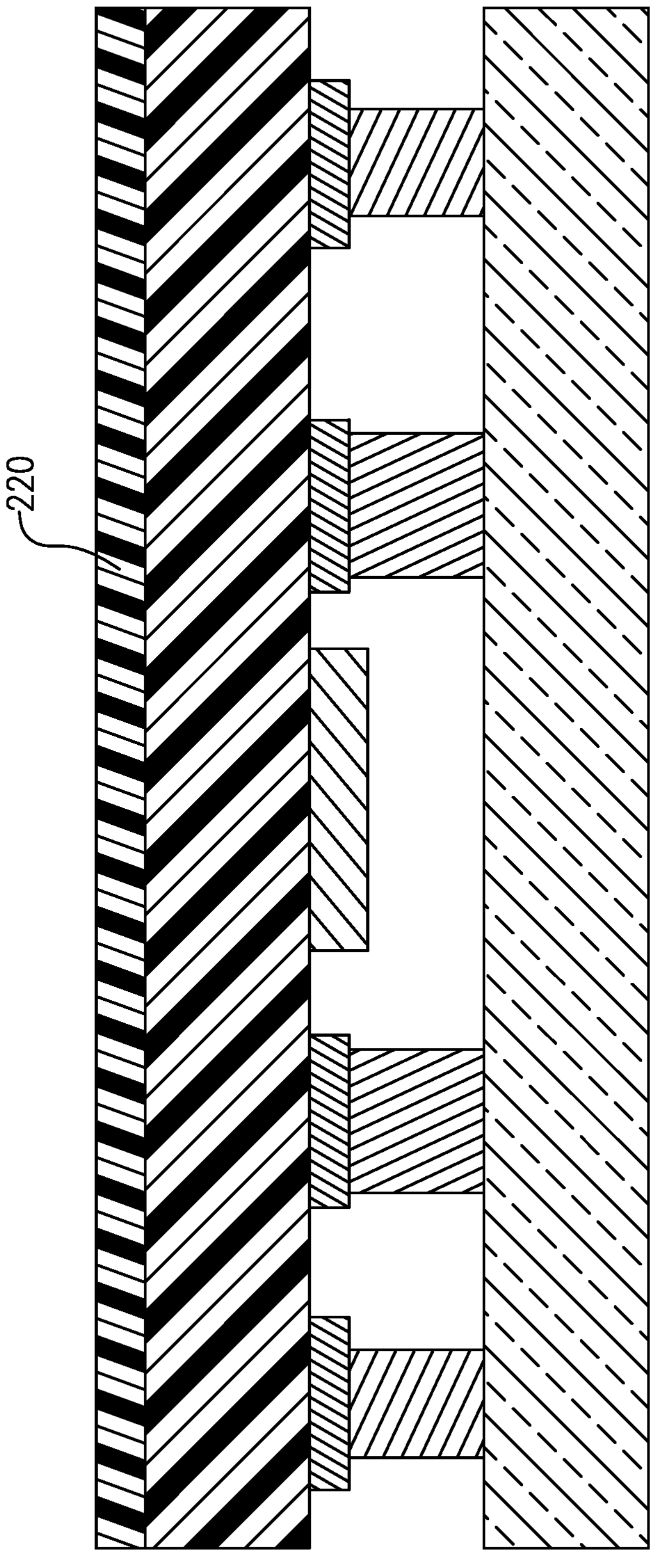
FIG. 4B illustrates another step in making the packaging structure of FIG. 2.

In act 320, a dielectric material layer 220 is deposited on the lower surface of the base wafer 120. The dielectric material 220 may be silicon dioxide deposited by, for example, a TEOS CVD process. The deposition process for the dielectric material layer 220 may be performed at a temperature lower than a temperature at which the solder bonds 150, 195 reflow or melt, for example, at 200° C. or less. The resultant structure is illustrated in FIG. 4B.

Figure 4C:
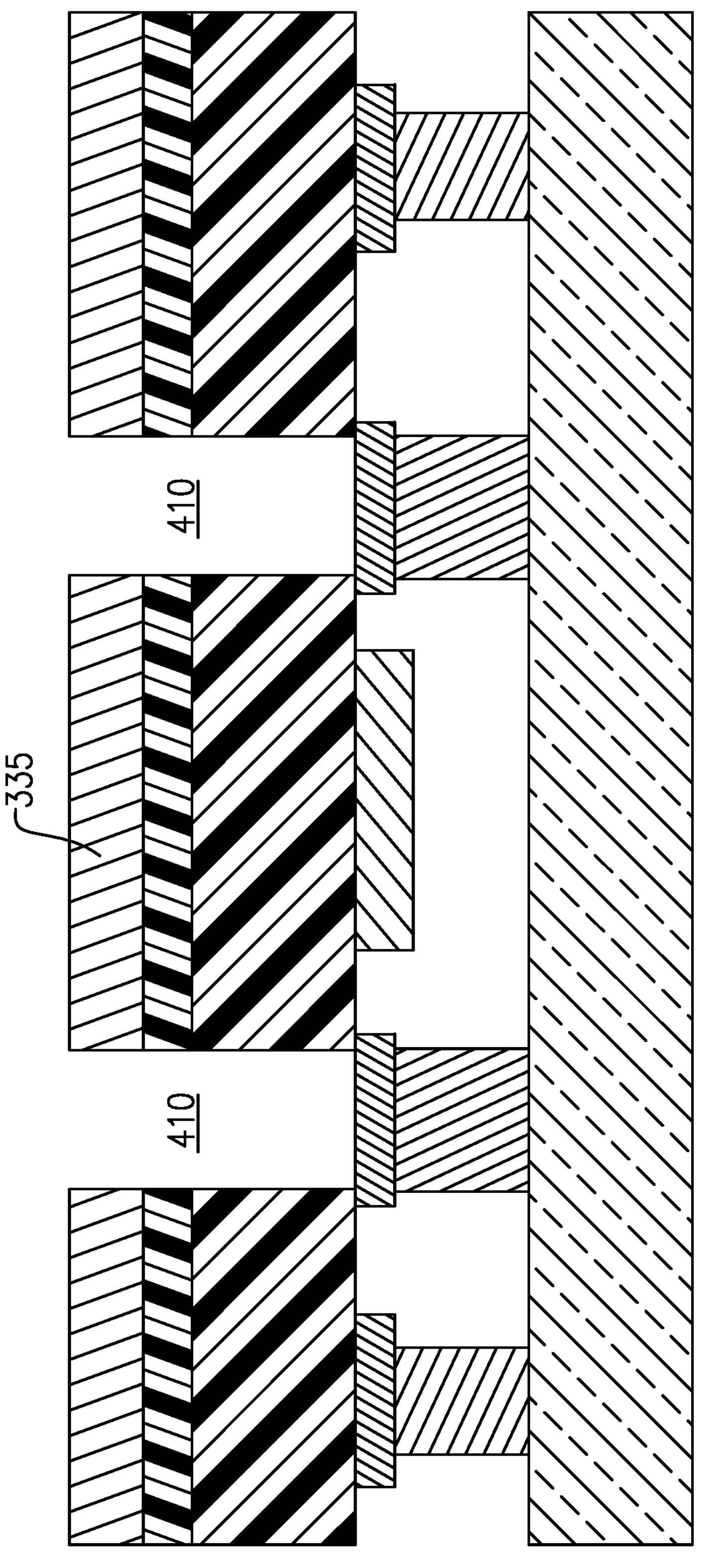
FIG. 4C illustrates another step in making the packaging structure of FIG. 2.

In act 330 via holes for through substrate vias are formed in the base wafer 120. As illustrated in FIG. 4C, a layer of photoresist 335 may be deposited and patterned and via holes 410 may be etched though the layer of dielectric 220 and the base substrate 120 using, for example, a plasma dry etch using $CH_4$ or $CHF_3$. Solder layers 150 may be used as etch stops.

Figure 4D:
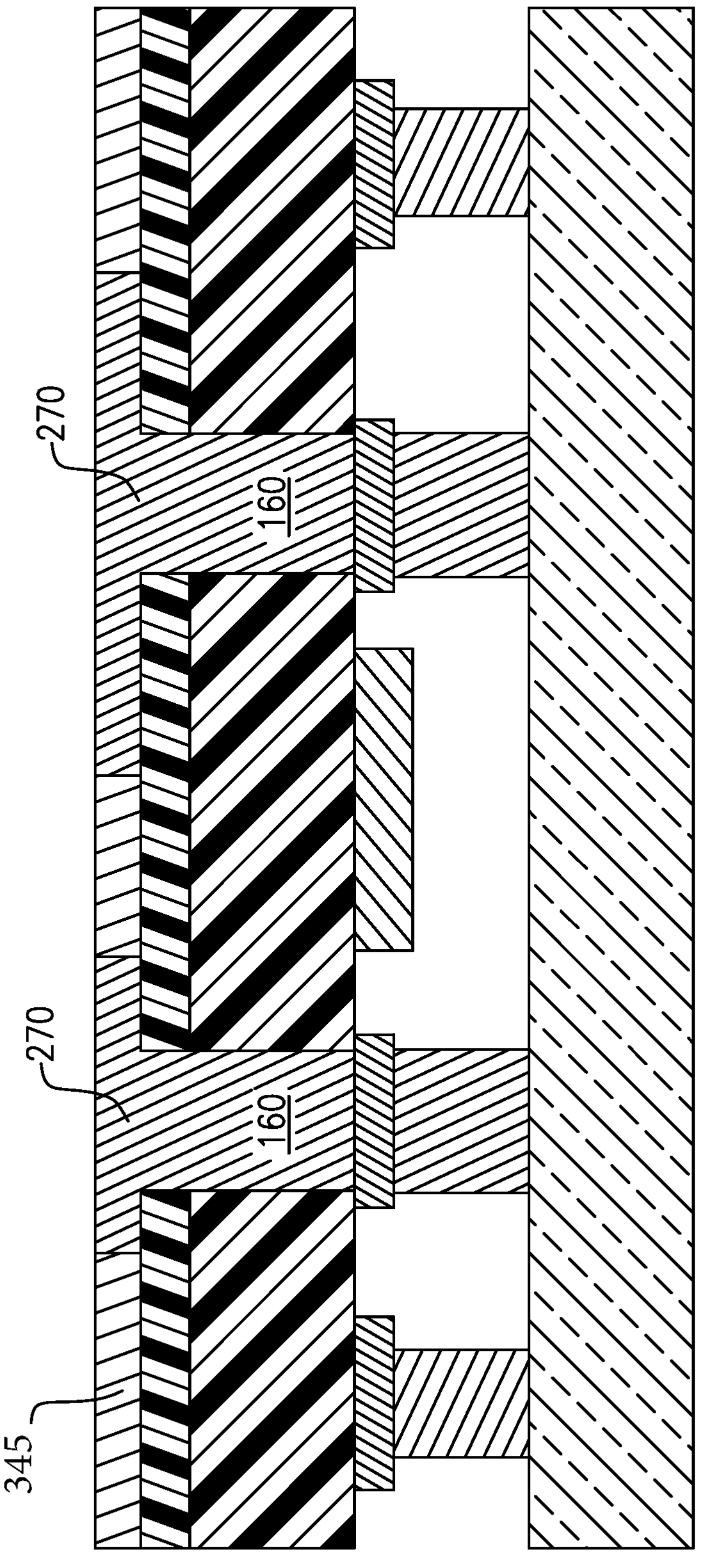
FIG. 4D illustrates another step in making the packaging structure of FIG. 2.
Figure 4E:
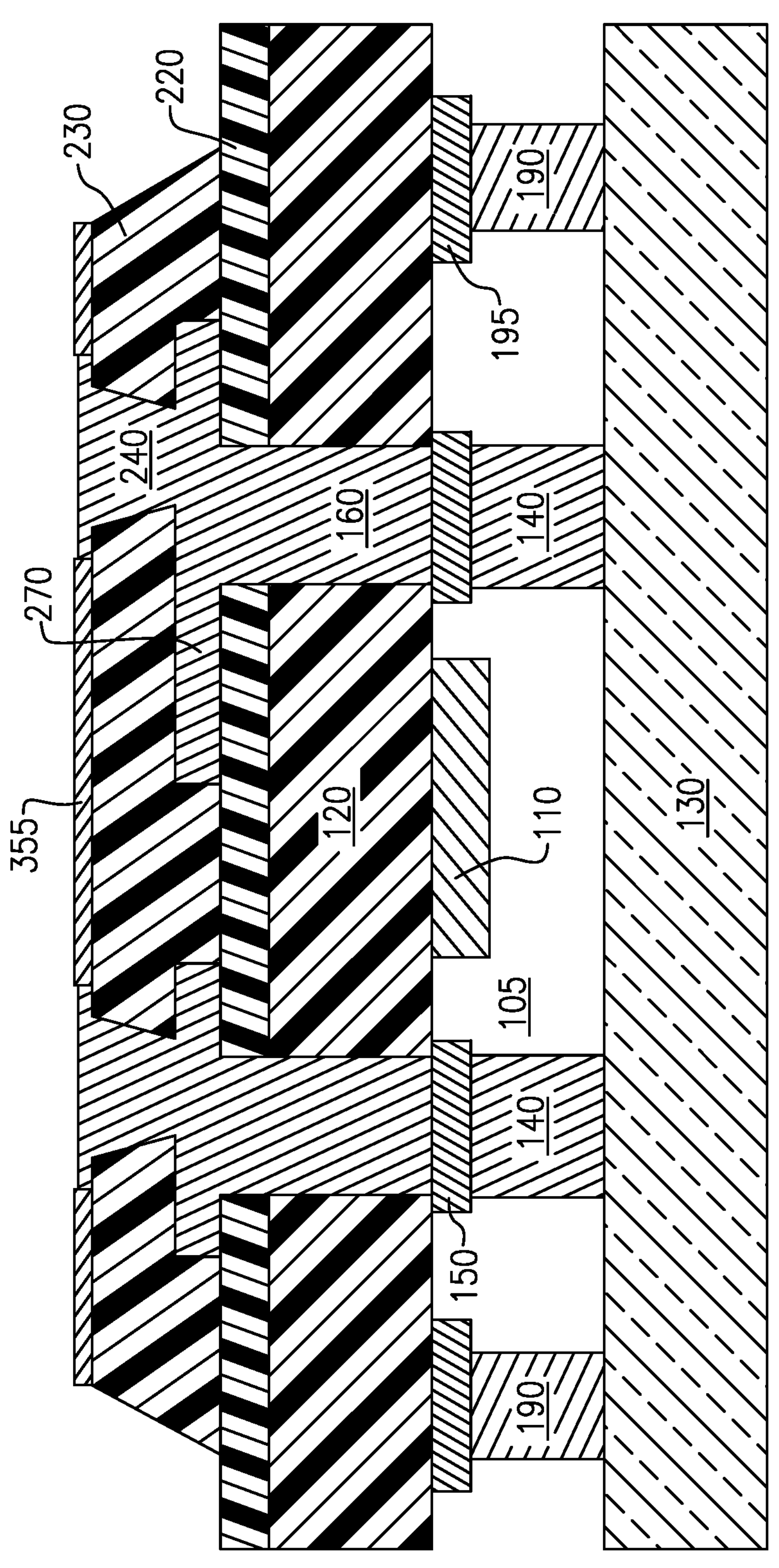
FIG. 4E illustrates another step in making the packaging structure of FIG. 2.

Photoresist 335 is removed and another layer of photoresist 345 is deposited and patterned to define regions for the redistribution layer/bond pads 270. The conductive material, for example, copper for forming the TSVs 160 and the redistribution layer/bond pads 270 is then deposited, for example, by electroplating in act 340. The resultant structure is shown in FIG. 4D.

Photoresist 345 is then removed and another layer of photoresist is deposited and patterned to define areas for the under-bump metallization structures/contact pads 240 and the under-bump metallization structures/contact pads 240 are formed by, for example, copper electroplating. The photoresist deposited and patterned for forming the under-bump metallization structures 240 may be or may include the dielectric material layer 230 as well as another layer of photoresist 355 deposited on the dielectric material layer 230 to define edges of the under-bump metallization structures/contact pads 240. (Act 350, FIG. 4E.)

In act 360, solder bumps may be deposited on the under-bump metallization structures either before or after the photoresist 355 is removed. The resultant final structure is that illustrated in FIG. 2. In further acts 370 and 380, the cap wafer 130 may optionally be thinned by back grinding, and wafers upon which multiple of the disclosed packages are formed may be diced to singulate the individual packages.

Each of acts 320-380 may be performed at temperatures lower that temperatures at which the solder bonds 150, 195 reflow or melt, for example, at 200° C. or less.

Figure 5:
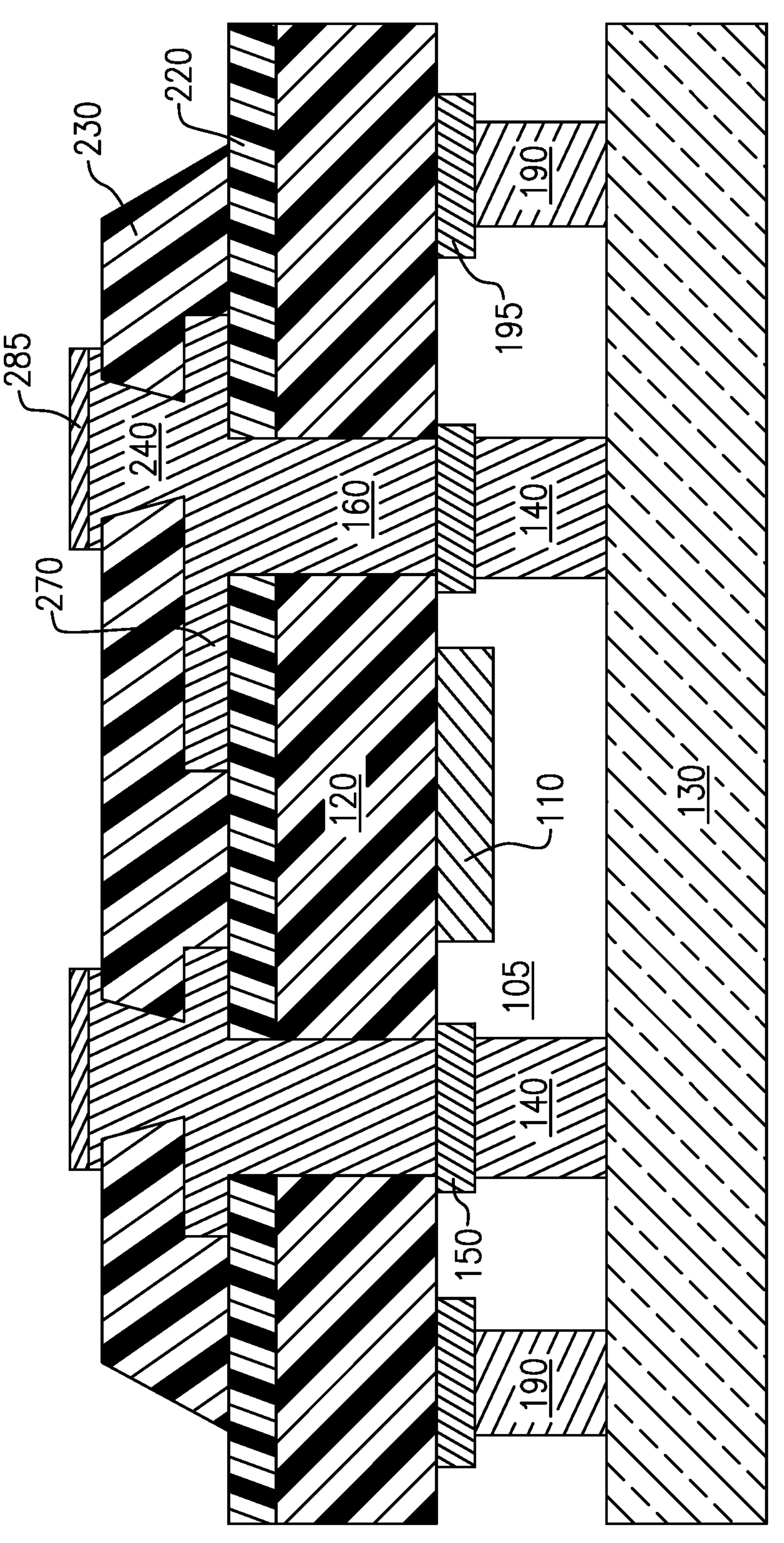
FIG. 5 illustrates a packaging structure configured with a land grid array bonding configuration.

In an alternate embodiment, illustrated in FIG. 5, instead of depositing solder bumps on the under-bump metallization structures, layers 285 of solder or other bonding material may be deposited on the under-bump metallization structures such that the package has a land grid array bonding structure rather than a ball grid array.

Figure 6:
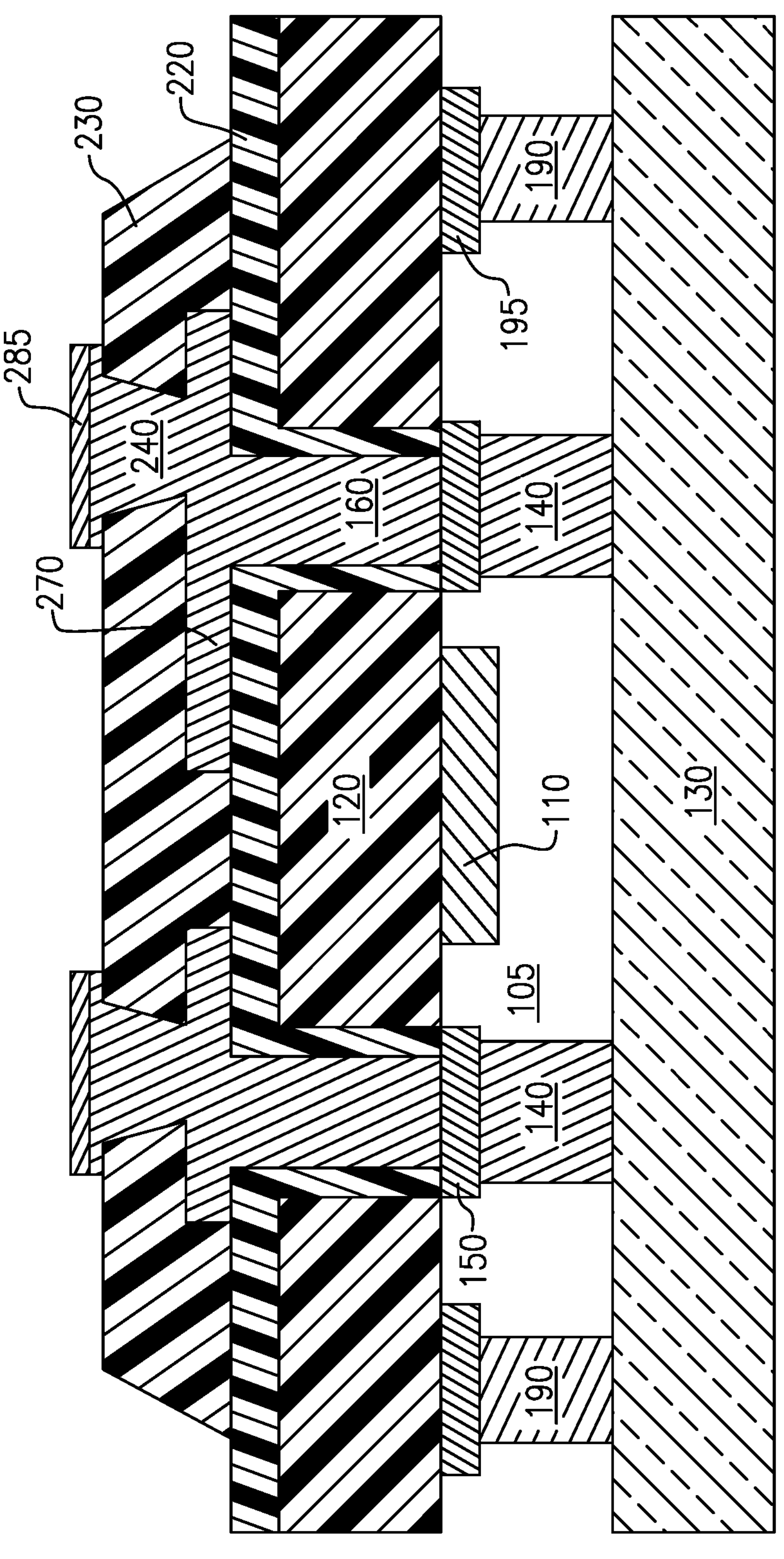
FIG. 6 illustrates an alternate embodiment of a packaging structure for a microelectromechanical system device.

In the embodiments of the packaging structure illustrated in FIGS. 2 and 5 the TSVs 160 are in direct contact with the substrate 120. There will be no significant electrical shorts between the TSVs through the substrate 120 if the substrate 120 is formed of a material with a substantially high resistivity, for example, silicon with a resistivity of at least 5 kΩ-cm. In some embodiments, to further prevent electrical shorts between the TSVs, the dielectric material layer 220 may extend into the TSV through-holes and separate the conductive material of the TSVs from the substrate 120 as illustrated in FIG. 6.

Figure 7:
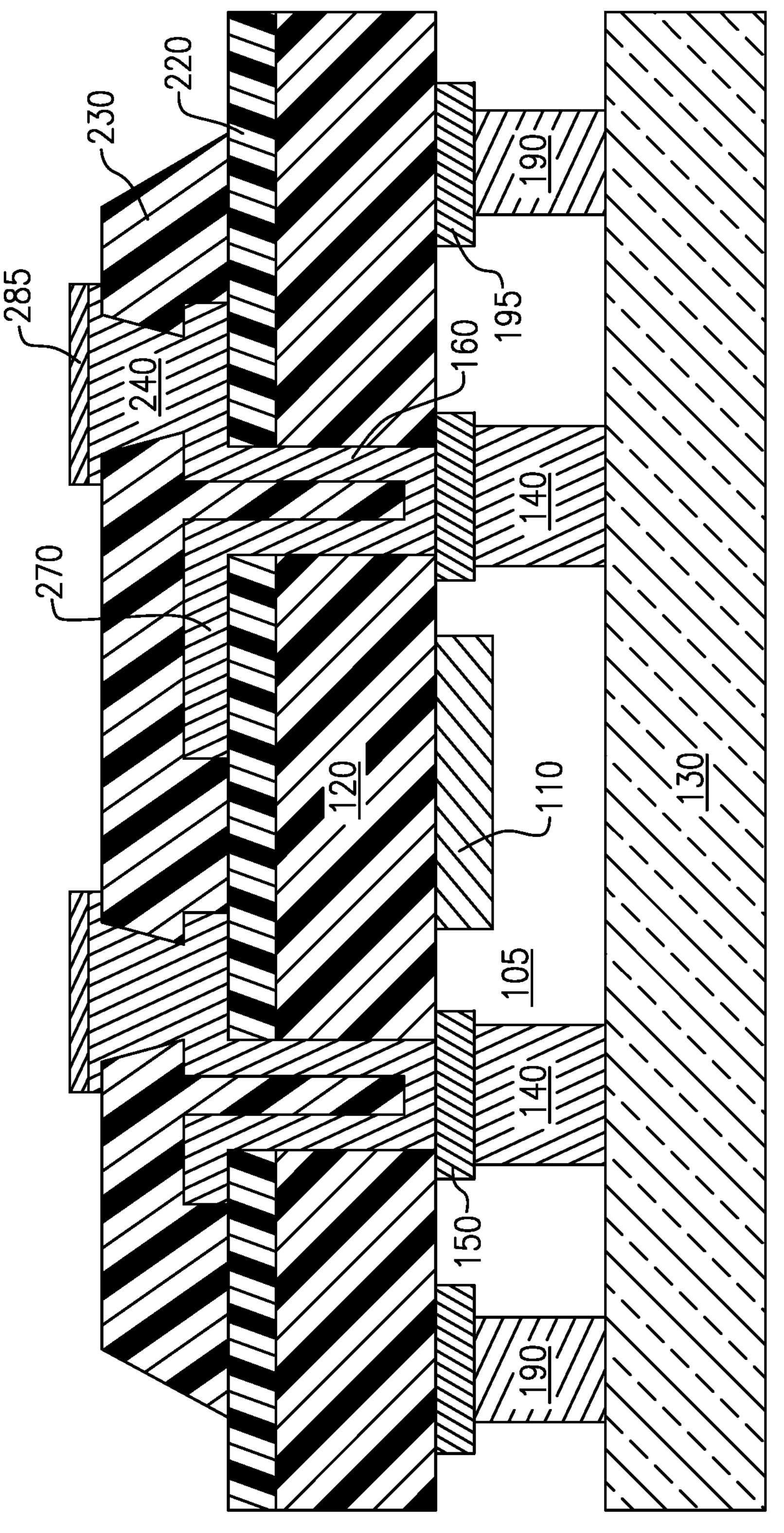
FIG. 7 illustrates another alternate embodiment of a packaging structure for a microelectromechanical system device.

In another embodiment, instead of filling the entire TSV through-holes with the conductive material of the TSVs 160 as illustrated in FIG. 4D above, the conductive material, for example, copper for forming the TSVs 160 and the redistribution layer/bond pads 270 may be conformally deposited, for example, by electroplating. The dielectric material 230 may then fill the central portions of the TSV through holes that do not include the conductive material. The resultant structure may then appear as illustrated in FIG. 7. In such embodiments, the under-bump metallization structures 240 and associated solder balls or bond pads would be horizontally offset from the TSVs 160 so that a good electrical connection with the redistribution layer 270 could be formed. In contrast in the embodiments in which the TSV via holes are filled with conductive material, for example, in the package structures of FIG. 2, 5, or 6, the under-bump metallization structures 240 and associated solder balls or bond pads could be formed directly over and centered over the TSVs 160.

Figure 8:
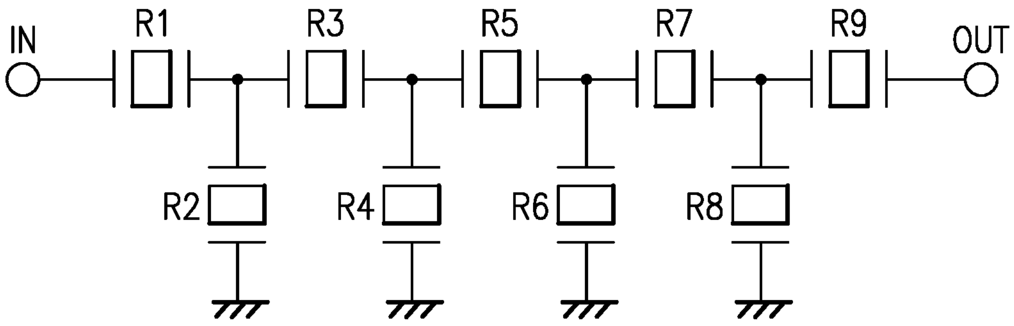
FIG. 8 is a schematic diagram of a radio frequency ladder filter.

In some embodiments, a packaged electronic or electrical device as disclosed herein may include a filter or may be combined with other packed electrical or electronic devices into a filter, for example, an RF ladder filter. An example of an RF ladder schematically illustrated in FIG. 8. The RF ladder filter includes a plurality of series resonators R1, R3, R5, R7, and R9, and a plurality of parallel (or shunt) resonators R2, R4, R6, and R8. As shown, the plurality of series resonators R1, R3, R5, R7, and R9 are connected in series between the input and the output of the RF ladder filter, and the plurality of parallel resonators R2, R4, R6, and R8 are respectively connected between series resonators and ground in a shunt configuration. Other filter structures and other circuit structures known in the art that may include MEMS devices or resonators, for example, duplexers, baluns, etc., may also be formed including examples of packaged devices as disclosed herein.

Figure 9:
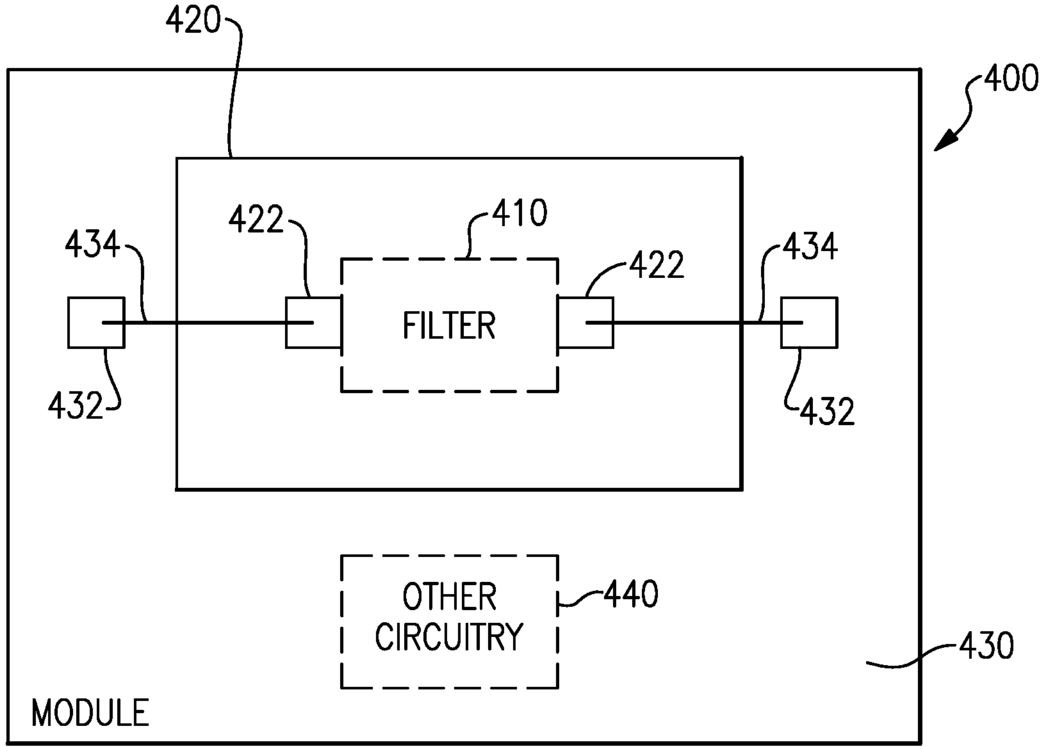
FIG. 9 is a block diagram of one example of a filter module that can include one or more acoustic wave elements according to aspects of the present disclosure.
Figure 10:
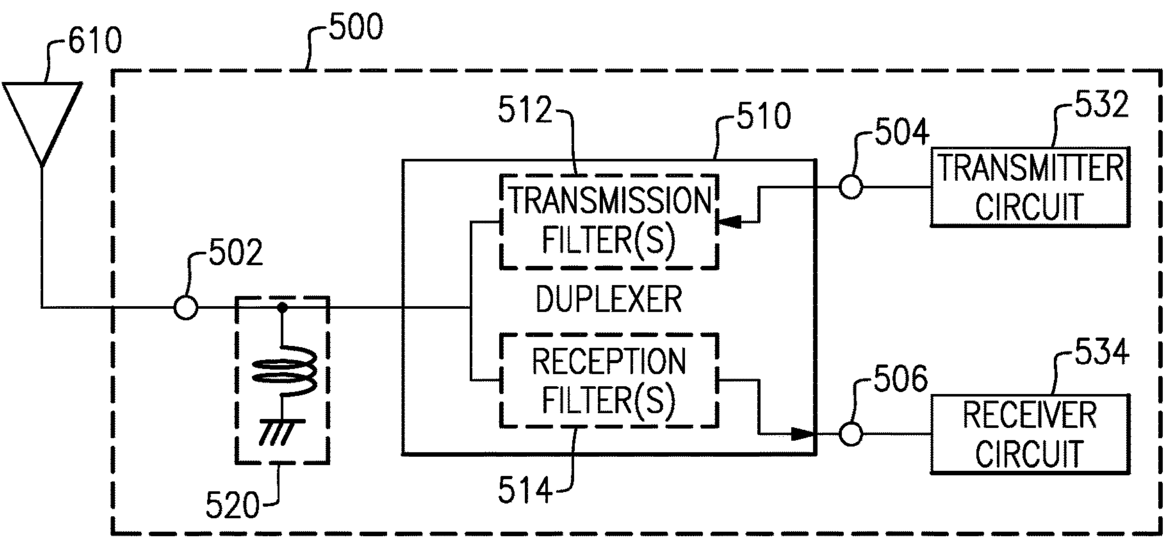
FIG. 10 is a block diagram of one example of a front-end module that can include one or more filter modules according to aspects of the present disclosure.
Figure 11:
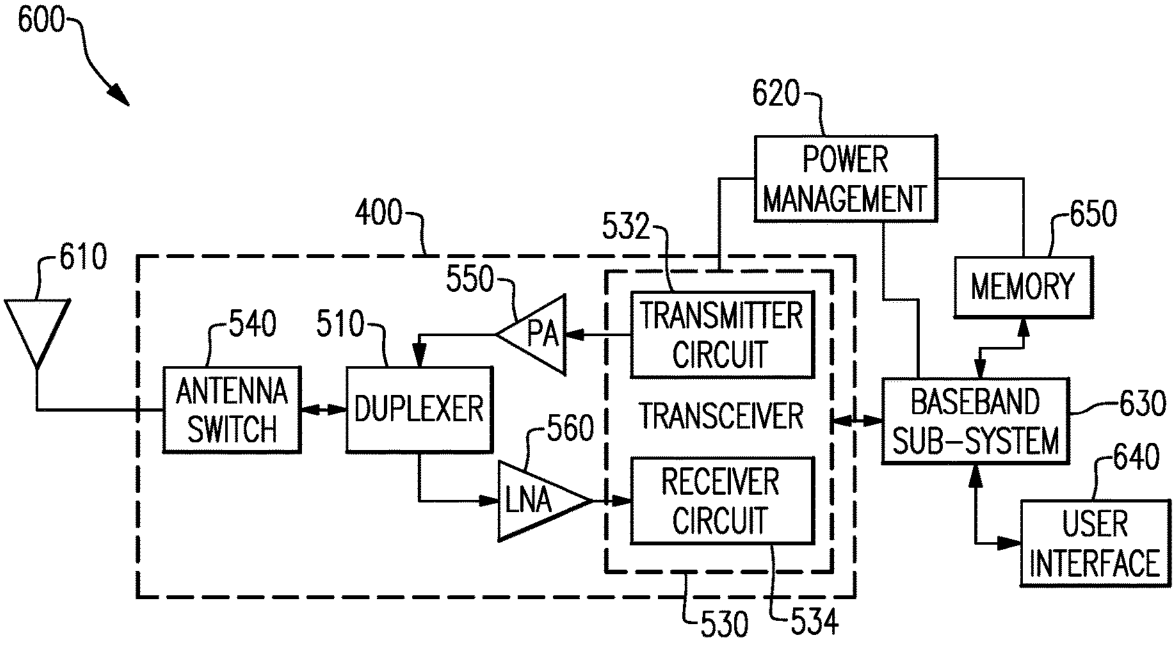
FIG. 11 is a block diagram of one example of a wireless device including the front-end module of FIG. 10.

A packaged electronic or electrical device, for example, a packaged acoustic wave device as disclosed herein can be implemented in a variety of packaged modules. Some example packaged modules will now be discussed in which any suitable principles and advantages of the packaged acoustic wave devices discussed herein can be implemented. FIGS. 9, 10, and 11 are schematic block diagrams of illustrative packaged modules and devices according to certain embodiments.

As discussed above, embodiments of the disclosed packaged devices can be configured as or used in filters, for example. In turn, a filter using one or more of the packaged devices may be incorporated into and packaged as a module that may ultimately be used in an electronic device, such as a wireless communications device, for example. FIG. 9 is a block diagram illustrating one example of a module 400 including an acoustic wave filter 410. The filter 410 may be implemented in one or more packages 420 including one or more contact pads 422. For example, the filter 410 may include a contact pad 422 that corresponds to an input contact for the filter and another contact pad 422 that corresponds to an output contact for the filter. The packaged module 400 includes a packaging substrate 430 that is configured to receive a plurality of components, including the package 420. A plurality of connection pads 432 can be disposed on the packaging substrate 430, and the various contact pads 422 of the filter package 420 can be connected to the connection pads 432 on the packaging substrate 430 via electrical connectors 434, which can be solder bumps or wirebonds, for example, to allow for passing of various signals to and from the filter 410. In other embodiments, the filter package 20 is flip-chip mounted on the packaging substrate 430. The module 400 may optionally further include other circuitry die 440, such as, for example, one or more additional filter(s), amplifiers, pre-filters, modulators, demodulators, down converters, and the like, as would be known to one of skill in the art of semiconductor fabrication in view of the disclosure herein. In some embodiments, the module 400 can also include one or more packaging structures to, for example, provide protection and facilitate easier handling of the module 400. Such a packaging structure can include an overmold formed over the packaging substrate 430 and dimensioned to substantially encapsulate the various circuits and components thereon.

Various examples and embodiments of the filter 410 can be used in a wide variety of electronic devices. For example, the filter 410 can be used in an antenna duplexer, which itself can be incorporated into a variety of electronic devices, such as RF front-end modules and communication devices.

Referring to FIG. 10, there is illustrated a block diagram of one example of a front-end module 500, which may be used in an electronic device such as a wireless communications device (e.g., a mobile phone) for example. The front-end module 500 includes an antenna duplexer 510 having a common node 502, an input node 504, and an output node 506. An antenna 610 is connected to the common node 502.

The antenna duplexer 510 may include one or more transmission filters 512 connected between the input node 504 and the common node 502, and one or more reception filters 514 connected between the common node 502 and the output node 506. The passband(s) of the transmission filter(s) are different from the passband(s) of the reception filter(s). Examples of the filter 410 can be used to form the transmission filter(s) 512 and/or the reception filter(s) 514. An inductor or other matching component 520 may be connected at the common node 502.

The front-end module 500 further includes a transmitter circuit 532 connected to the input node 504 of the duplexer 510 and a receiver circuit 534 connected to the output node 506 of the duplexer 510. The transmitter circuit 532 can generate signals for transmission via the antenna 610, and the receiver circuit 534 can receive and process signals received via the antenna 610. In some embodiments, the receiver and transmitter circuits are implemented as separate components, as shown in FIG. 10, however in other embodiments these components may be integrated into a common transceiver circuit or module. As will be appreciated by those skilled in the art, the front-end module 500 may include other components that are not illustrated in FIG. 10 including, but not limited to, switches, electromagnetic couplers, amplifiers, processors, and the like.

FIG. 11 is a block diagram of one example of a wireless device 600 including the antenna duplexer 510 shown in FIG. 10. The wireless device 600 can be a cellular phone, smart phone, tablet, modem, communication network or any other portable or non-portable device configured for voice or data communication. The wireless device 600 can receive and transmit signals from the antenna 610. The wireless device includes an embodiment of a front-end module 500 similar to that discussed above with reference to FIG. 10. The front-end module 500 includes the duplexer 510, as discussed above. In the example shown in FIG. 11 the front-end module 500 further includes an antenna switch 540, which can be configured to switch between different frequency bands or modes, such as transmit and receive modes, for example. In the example illustrated in FIG. 11, the antenna switch 540 is positioned between the duplexer 510 and the antenna 610; however, in other examples the duplexer 510 can be positioned between the antenna switch 540 and the antenna 610. In other examples the antenna switch 540 and the duplexer 510 can be integrated into a single component.

The front-end module 500 includes a transceiver 530 that is configured to generate signals for transmission or to process received signals. The transceiver 530 can include the transmitter circuit 532, which can be connected to the input node 504 of the duplexer 510, and the receiver circuit 534, which can be connected to the output node 506 of the duplexer 510, as shown in the example of FIG. 10.

Signals generated for transmission by the transmitter circuit 532 are received by a power amplifier (PA) module 550, which amplifies the generated signals from the transceiver 530. The power amplifier module 550 can include one or more power amplifiers. The power amplifier module 550 can be used to amplify a wide variety of RF or other frequency-band transmission signals. For example, the power amplifier module 550 can receive an enable signal that can be used to pulse the output of the power amplifier to aid in transmitting a wireless local area network (WLAN) signal or any other suitable pulsed signal. The power amplifier module 550 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 550 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 11, the front-end module 500 may further include a low noise amplifier module 560, which amplifies received signals from the antenna 610 and provides the amplified signals to the receiver circuit 534 of the transceiver 530.

The wireless device 600 of FIG. 11 further includes a power management sub-system 620 that is connected to the transceiver 530 and manages the power for the operation of the wireless device 600. The power management system 620 can also control the operation of a baseband sub-system 630 and various other components of the wireless device 600. The power management system 620 can include, or can be connected to, a battery (not shown) that supplies power for the various components of the wireless device 600. The power management system 620 can further include one or more processors or controllers that can control the transmission of signals, for example. In one embodiment, the baseband sub-system 630 is connected to a user interface 640 to facilitate various input and output of voice and/or data provided to and received from the user. The baseband sub-system 630 can also be connected to memory 650 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An electronic device package comprising:

a base substrate having an upper surface and a lower surface;

an electrical device disposed on the upper surface of the base substrate;

a conductive column in electrical communication with the electrical device and having a first end bonded to the upper surface of the base substrate;

a cap substrate disposed over the electrical device and having a lower surface bonded to a second end of the conductive column;

a layer of dielectric material having an upper surface disposed on the lower surface of the base substrate;

a through substrate via in electrical communication with the conductive column and passing through the base substrate and the layer of dielectric material;

a redistribution layer disposed on a lower surface of the layer of dielectric material; and a contact pad formed on a lower surface of the redistribution layer and in electrical communication with the through substrate via through the redistribution layer, the contact pad being horizontally displaced from a position directly below the through substrate via, to improve flexibility for mounting the electronic device package on an electronics module.

2. The electronic device package of claim 1 wherein the base substrate is formed of high resistivity silicon.

3. The electronic device package of claim 1 wherein the contact pad at least partially overlaps the through substrate via.

4. The electronic device package of claim 1 wherein the contact pad does not overlap the through substrate via.

5. The electronic device package of claim 1 wherein the conductive column is bonded with a solder bond to one of the upper surface of the base substrate or the lower surface of the cap substrate.

6. The electronic device package of claim 5 further comprising a buffer coat layer disposed on a lower surface of the redistribution layer and in contact with sides of the contact pad, the buffer coat layer being formed of a material having a lower curing temperature than a melting temperature of the solder bond.

7. The electronic device package of claim 6 wherein a curing temperature of the material of the buffer coat layer is 200° C. or less.

8. The electronic device package of claim 6 wherein the buffer coat layer comprises polyimide.

9. The electronic device package of claim 5 wherein the layer of dielectric material is formed of a material having a deposition temperature less than a melting temperature of the solder bond.

10. The electronic device package of claim 9 wherein a deposition temperature of the layer of dielectric material is 200° C. or less.

11. The electronic device package of claim 9 wherein the layer of dielectric material comprises silicon dioxide.

12. The electronic device package of claim 1 wherein the redistribution layer includes a bond pad that is not centered below the through substrate via.

13. The electronic device package of claim 5 wherein the redistribution layer is formed of a material having a lower deposition temperature than a melting temperature of the solder bond.

14. The electronic device package of claim 13 wherein a deposition temperature of the redistribution layer is 200° C. or less.

15. The electronic device package of claim 13 wherein the redistribution layer comprises copper.

16. The electronic device package of claim 1 wherein the electrical device is a MEMS device.

17. The electronic device package of claim 16 wherein the electrical device is an acoustic wave resonator.

18. An electronic device module including the electronic device package of claim 1.

19. An electronic device including the electronic device module of claim 18.

20. A method of manufacturing a packaged electronic device, the method comprising:

forming an electronic device in an upper surface of a base substrate;

forming a conductive column in electrical communication with the electronic device and having a first end bonded to the upper surface of the base substrate;

mounting a cap substrate over the electrical device, mounting the cap substrate including bonding a lower surface of the cap substrate to a second end of the conductive column;

depositing a layer of dielectric material on the lower surface of the base substrate;

forming a through substrate via in electrical communication with the conductive column and passing through the base substrate and the layer of dielectric material;

depositing a redistribution layer on a lower surface of the layer of dielectric material; and forming a contact pad on a lower surface of the redistribution layer and in electrical communication with the through substrate via through the redistribution layer, the contact pad being horizontally displaced from a position directly below the through substrate via.

21. The method of claim 20 wherein the first end of the conductive column is bonded to the upper surface of the base substrate with a solder bond, the method further comprising depositing a buffer coat layer on a lower surface of the redistribution layer and in contact with sides of the contact pad, the buffer coat layer being formed of a material having a lower curing temperature than a melting temperature of the solder bond.

22. The method of claim 20 wherein the first end of the conductive column is bonded to the upper surface of the base substrate with a solder bond, and the layer of dielectric material is deposited at a temperature lower than a melting temperature of the solder bond.

23. The method of claim 20 wherein the first end of the conductive column is bonded to the upper surface of the base substrate with a solder bond, and the redistribution layer is deposited at a temperature lower than a melting temperature of the solder bond.

* * * * *